United States Patent [19]

Ogino et al.

[11] Patent Number: 5,548,247

[45] Date of Patent: Aug. 20, 1996

[54] AMPLIFIER HAVING A FIELD-EFFECT TRANSISTOR WITH GATE BIASED AT A POTENTIAL LOWER THAN SOURCE POTENTIAL

[75] Inventors: Toshikazu Ogino; Ryoji Yamamoto, both of Atsugi, Japan

[73] Assignee: Mitsumi Electric Co., Ltd., Tokyo, Japan

[21] Appl. No.: 364,773

[22] Filed: Dec. 27, 1994

[30] Foreign Application Priority Data

Dec. 28, 1993 [JP] Japan .................. 5-70720 U

[51] Int. Cl.⁶ .................................................. H03F 3/16
[52] U.S. Cl. ........................ 330/277; 330/296; 330/300
[58] Field of Search ............................ 330/85, 277, 286, 330/296, 300

[56] References Cited

U.S. PATENT DOCUMENTS 4,792,987  12/1988  Tumeo ........................... 330/85
5,162,755  11/1992  Mara et al. .................. 330/286 X
5,374,899  12/1994  Griffiths et al. ............. 330/296 X

FOREIGN PATENT DOCUMENTS 3-46806   2/1991   Japan .
6-224647  8/1994   Japan .

*Primary Examiner*—Steven Mottola
*Attorney, Agent, or Firm*—Michael N. Meller

[57]  ABSTRACT

An amplifier includes: a FET having a source electrode, a drain electrode and a gate electrode, wherein an input signal input to the gate electrode is amplified by the FET and an output signal indicating the amplified input signal is output from the drain electrode; a first voltage biasing unit, coupled to the source electrode of the FET, for biasing the source electrode at a preset positive potential; and a second voltage biasing unit, coupled to the gate electrode of the FET, for biasing the gate electrode at a potential lower than the potential of the source electrode during the operation of the FET.

5 Claims, 2 Drawing Sheets

5,548,247

AMPLIFIER HAVING A FIELD-EFFECT TRANSISTOR WITH GATE BIASED AT A POTENTIAL LOWER THAN SOURCE POTENTIAL

BACKGROUND OF THE INVENTION (1) Field of the Invention

The present invention generally relates to an amplifier, and more particularly to an amplifier having a field-effect transistor (FET) with a gate electrode biased at a potential lower than a potential of a source electrode, wherein an input signal to the gate electrode is amplified and an output signal indicating the amplified input signal is output from a drain electrode.

(2) Description of the Related Art

FIG. 1 shows a conventional amplifier having a field-effect transistor (FET). This amplifier is used as a first-stage amplifier which is provided within a low-noise amplifying unit of a global positioning system (GPS) receiving subsystem.

A global positioning system GPS is widely used for precise radio navigation. In the GPS, a network of various GPS satellites and a dozen ground stations are employed for monitoring and control positioning of a vehicle is achieved by utilizing microwave communications between the satellites and the ground stations. The vehicle derives the three-dimensional position and velocity of the vehicle from ranging signals at 1.57542 GHz received from four or more GPS satellites. The most recent position of the vehicle can be accurately indicated by longitude, latitude, and attitude by utilizing the received signals by the GPS.

A GPS receiving subsystem comprises an antenna unit, a receiver unit, a signal processing unit, and a display unit. The antenna unit includes a plane antenna element and a low-noise amplifying unit.

The low-noise amplifying unit mentioned above includes the first-stage amplifier shown in FIG. 1, a low-pass filter, and a final-stage amplifier. The processed signals whose voltage is amplified at a predetermined level and have a wavelength is restricted below the upper limit of the low-pass filter. The amplified are transmitted from the final-stage amplifier to the receiver unit in the GPS receiving subsystem.

In the GPS receiving subsystem described above, very small signals at 1.57542 GHz from the GPS satellites are received at the antenna unit, and such signals from the antenna unit are amplified by the first-stage amplifier. For this reason, a first-stage amplifier must have the high signal-to-noise (S/N) ratio. In order to meet this requirement, a HEMT (high electron mobility transistor) GaAs (gallium arsenide) FET is widely used.

In FIG. 1, the conventional amplifier 10 includes a DC-DC converter 11 and a HEMT GaAs FET Q1 (which will be hereinafter called the transistor Q1). The transistor Q1 has a source electrode which is grounded, and has a gate electrode which is coupled to a stripline L2 and a capacitor C3 in series. Hereinafter, the strip line will be referred to as a coil in the form fabricated on a printed circuit board. An input signal Vin, output from the plane antenna element of the antenna unit, is supplied to the gate electrode of the transistor Q1 via the capacitor C3 and the stripline L2. The transistor Q1 further includes a drain electrode which is coupled to two striplines L3 and L4 and a capacitor C4 in series. An output signal Vout is output from the drain electrode of the transistor Q1 via the striplines L3 and L4 and the capacitor C4.

In the conventional amplifier 10 in FIG. 1, the DC-DC converter 11 converts a positive source dc voltage +5 V, supplied from an external power supply (not shown) via a source power terminal 12, to a negative source dc voltage −5 V. In other words, the conventional amplifier 10 requires a first positive DC voltage supply and a DC-DC converter to supply a negative DC voltage. The amplifier 10 further includes a constant current circuit 13 and a voltage biasing circuit 14.

The constant current circuit 13 mentioned above includes: a resistor R3 connected to an output of the DC-DC converter 11; a resistor R10 connected to the source power terminal 12; a transistor Q2; a diode D2; a resistor R6 interposed between the resistor R3 and the transistor Q2; a resistor R7 interposed between the transistor Q2 and the resistor R10; a resistor R8 connected to the transistor Q2; and a resistor R9 interposed between the transistor Q2 and the diode D2. One end of the resistor R8 is grounded.

In the conventional amplifier in FIG. 1, a connection point between the resistor R7 and the resistor R10 and a connection point between the stripline L3 and the stripline L4 are connected by a stripline L5. The current through the drain electrode of the transistor Q1 is biased by the constant current circuit 13 through the striplines L3 and L5.

The voltage biasing circuit 14 mentioned above includes the resistor R3, a resistor R4, a stripline L1, a resistor R5, these three circuit elements being connected to the resistor R3 in series, and a stripline L1 L2 interposed between the resistor R5 and the transistor Q1.

In the conventional amplifier described above, the difference between the positive source dc voltage (+5 V) and the negative source dc voltage (−5 V) is divided by the resistors R10 and R7, the transistor Q2 and the resistors R6 and R3, and the connection point between the resistor R3 and the resistor R6 is set to a negative potential with respect to the ground level.

The negative potential at the connection point between the resistors R3 and R6 is applied to the gate electrode of the transistor Q1 through the resistor R4, the stripline L1, the resistor R5 and the stripline L2. Thus, in the conventional amplifier 10, it is necessary that the gate electrode of the transistor Q1 (HEMT GaAs FET) is biased at a negative potential, the source electrode is grounded, and the transistor Q1 amplifies the input signal under this condition to output the amplified input signal from the drain electrode.

Therefore, the conventional amplifier described above requires using a DC-DC converter, which is expensive, for the conversion of the positive source dc voltage (e.g. +5 V) to the negative source dc voltage (e.g. −5 V). For this reason, the conventional amplifier has a problem in that it has a complicated structure, and packaging the amplifier on a printed circuit board with a small size and high packaging density is difficult. Also, the cost of manufacture of the conventional amplifier is high because of the use of a DC-DC converter.

SUMMARY OF THE INVENTION

Accordingly, it is a general object of the present invention to provide an improved amplifier in which the above-described problem is eliminated.

Another, more specific object of the present invention is to provide an amplifier which has a simple structure with a small size permitting a high packaging density with no need for an expensive DC-DC converter used by the conventional amplifier.

The above-mentioned object of the present invention is achieved by an amplifier which includes: a FET having a source electrode, a drain electrode and a gate electrode, wherein an input signal to the gate electrode is amplified by the FET and an output signal indicating the amplified input signal is output from the drain electrode; a first voltage biasing unit, coupled to the source electrode of the FET, for biasing the source electrode at a preset positive potential; and a second voltage biasing unit, coupled to the gate electrode of the FET, for biasing the gate electrode at a potential lower than the potential of the source electrode during the operation of the FET.

When the amplifier of the present invention is operated for the amplification of input signals, the gate electrode is biased at a potential lower than the potential of the source electrode with no need for a DC-DC converter. Thus, the amplifier of the present invention can have a simple structure with a small size permitting a high packaging density. In addition, the cost of manufacture of the amplifier of the present invention can be lower than that of the conventional amplifier.

BRIEF DESCRIPTION OF THE DRAWINGS

Other objects, features and advantages of the present invention will become more apparent from the following detailed description when read in conjunction with the accompanying drawings in which.

DESCRIPTION OF THE PREFERRED EMBODIMENT

A description will now be given of an amplifier in a preferred embodiment of the present invention, with reference to FIG. 2.

Figure 1:
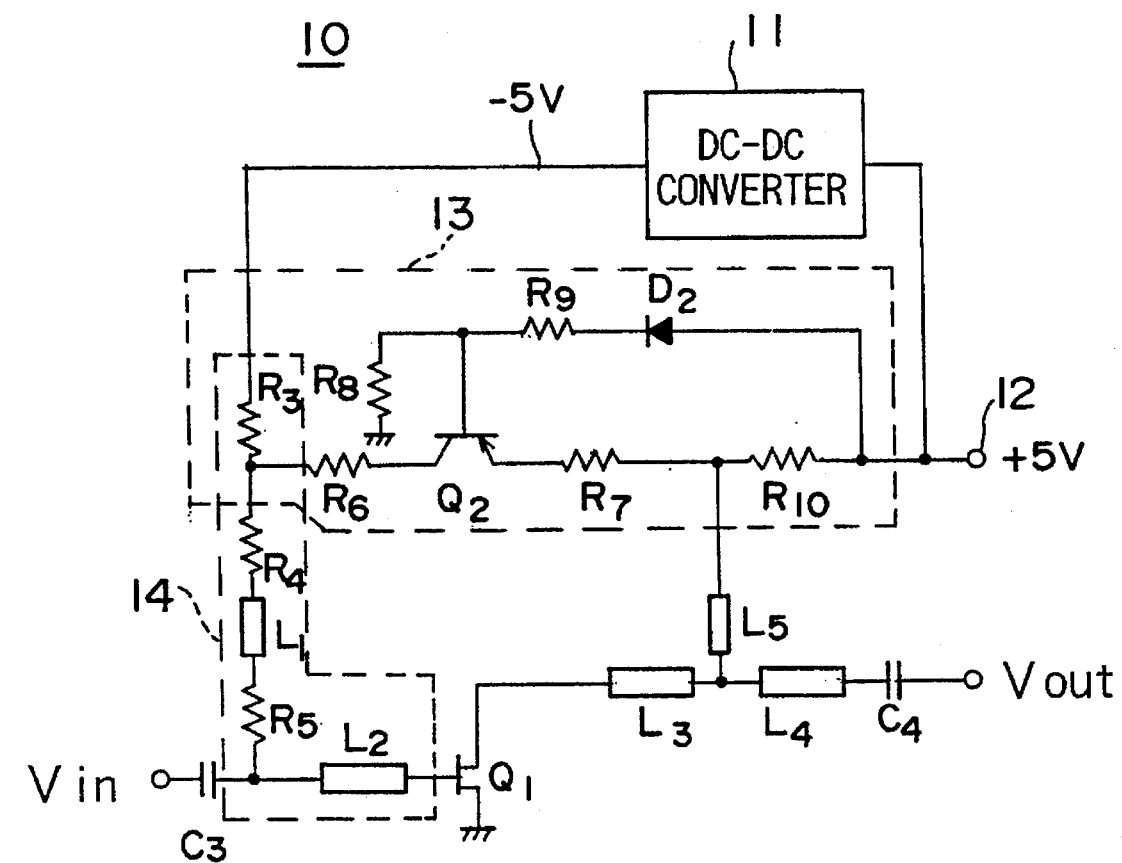
FIG. 1 is a circuit diagram showing a conventional amplifier having a field-effect transistor.
Figure 2:
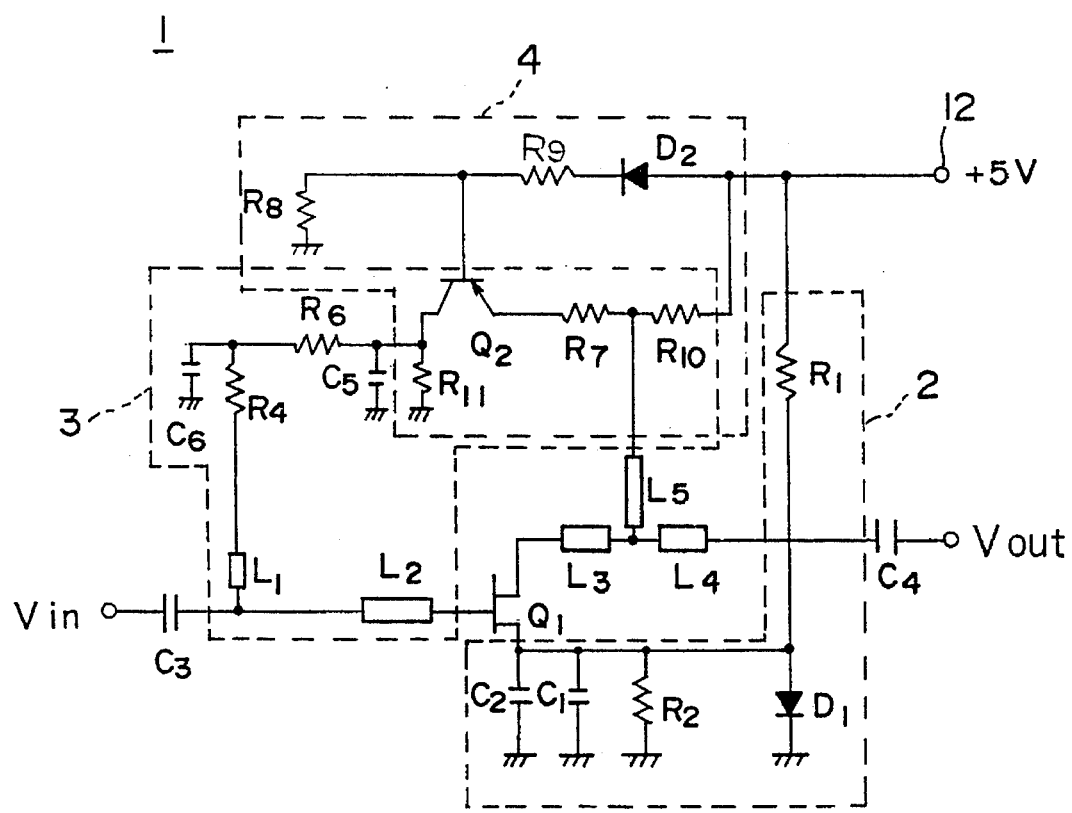
FIG. 2 is a circuit diagram showing an improved amplifier having a field-effect transistor in a preferred embodiment of the present invention.

Similarly to the conventional amplifier 10 in FIG. 1, the amplifier 1 in the preferred embodiment of the invention shown in FIG. 2 is used as the first-stage amplifier which is provided for use in the low-noise amplifying unit of the GPS receiving subsystem. Similarly to the conventional amplifier in FIG. 1, very small signals from the plane antenna element are amplified by the amplifier shown in FIG. 2. For this reason, the amplifier in the preferred embodiment of the invention in FIG. 2 employs a HEMT GaAs FET having a high S/N ratio, and carries out the amplification of very small signals from the plane antenna element.

In FIG. 2, the amplifier 1 includes the HEMT GaAs FET Q1 (which will be referred to the transistor Q1), a first voltage biasing unit 2, a second voltage biasing unit 3, and a constant current circuit 4.

In FIG. 2, the transistor Q1 has a source electrode coupled to the first voltage biasing unit 2, and has a gate electrode coupled to a stripline L2 and a capacitor C3 in series. These stripline and capacitor are fabricated on a printed circuit board. An input signal Vin from the plane antenna element of the antenna unit is input to the gate electrode of the transistor Q1 via the capacitor C3 and the stripline L2, and the input signal is amplified by the transistor Q1. The transistor Q1 further includes a drain electrode coupled to two striplines L3 and L4 and a capacitor C4 in series. An output signal indicating the amplified input signal is output from the drain electrode of the transistor Q1, and an output signal Vout is output via the striplines L3 and L4 and the capacitor C4.

The first voltage biasing unit 2 mentioned above includes a resistor R1, a diode D1, a resistor R2, and two capacitors C1 and C2 which are connected in parallel. The source electrode of the transistor Q1 and the source power terminal 12 (from which a positive source dc voltage +5 V from an external power supply is input) are connected by the resistor R1. One end of each of the diode D1, the resistor R2 and the capacitors C1 and C2, is connected to the source electrode of the transistor Q1, and the other end of each of these circuit elements is grounded.

The diode D1 in the first voltage biasing unit 2 has an anode electrode coupled to the source electrode of the transistor Q1 and a cathode electrode grounded. The anode electrode of the diode D1 is placed at a preset positive potential higher than the potential of the grounded cathode electrode of the diode D1. Thus, the source electrode of the transistor Q1 is biased at a preset positive potential (e.g., about +0.6 volt) by the first voltage biasing unit 2.

The constant current circuit 4 mentioned above includes a transistor Q2, three resistors R7, R10 and R11, a diode D2, and two resistors R8 and R9. The resistors R7 and R10 are connected in series, the other end of the resistor R10 is connected to the source power terminal 12. The other end of the resistor R7 is connected to the emitter electrode of the transistor Q2. One end of the resistor R11 is connected to the collector electrode of the transistor Q2, and the other end of the resistor R11 is grounded.

Similarly to the conventional amplifier in FIG. 1, a connection point between the resistor R7 and the resistor R10 and a connection point between the stripline L3 and the stripline L4 are connected by the stripline L5. Thus, the current through the drain electrode of the transistor Q1 is biased by the constant current circuit 4 through the striplines L3 and L5.

The second voltage biasing unit 3 mentioned above includes: the resistor R10 with its end coupled to the source power terminal 12; the resistor R7 with its end coupled to the other end of the resistor R10; the transistor Q2 with the emitter coupled to the other end of the resistor R7; the resistor R11 with its end coupled to the collector of the transistor Q2 and with the other end grounded; a capacitor C5 connected in parallel to the resistor R11; a resistor R6 with its end coupled to the collector of the transistor Q2; a resistor R4 with its end coupled to the other end of the resistor R6; a capacitor C6 with its end coupled to the other end of the resistor R6 and with the other end grounded; a stripline L1 with its end coupled to the other end of the resistor R4; and a stripline L2 with its end coupled to the other end of the stripline L1 and with the other end coupled to the gate electrode of the transistor Q1. A connection point between the striplines L1 and L2 is connected to the input terminal "Vin" via the capacitor C3.

The capacitors C5 and C6 in the second voltage biasing unit 3 are provided to eliminate noises from the source dc power supplied from the source power terminal 12.

In the second voltage biasing unit 3 described above, the resistance of each of the resistor R11, the transistor Q2 (the resistance between the emitter and the collector), and the resistors R7 and R10 is predetermined such that the gate electrode of the transistor Q1 is biased at a potential lower than the preset positive potential (e.g., about 0.6 volt) of the source electrode. Further, in the second voltage biasing unit 3 described above, the resistance of each of the resistor R11, the resistor R4, the stripline L1 and the stripline L2 is predetermined such that the gate electrode of the transistor Q1 is biased at the abovementioned potential that is lower than the preset positive potential of the source electrode.

The amplifier 1, shown in FIG. 2, amplifies the input signal Vin input to the gate electrode and outputs the amplified input signal Vout from the drain electrode under the condition described above by making use of the first voltage biasing unit 2 and the second voltage biasing unit 3.

As described above, the amplifier according to the present invention does not require the use of an expensive DC-DC converter, used by the conventional amplifier for conversion of the positive source dc voltage to the negative source dc voltage. Thus, the amplifier according to the present invention can have a simple structure with a small size permitting a high packaging density. Therefore, the cost of manufacture of the amplifier of the present invention can be made lower than the cost of manufacture of the conventional amplifier.

In addition, the principle of the present invention may be applied to not only an amplifier having a gallium-arsenide field-effect transistor but also an amplifier having a junction field-effect transistor (JFET).

Further, the present invention is not limited to the above-described embodiment, and variations and modifications may be made without departing from the scope of the present invention.

What is claimed is:

1. An amplifier comprising:

a FET having a source electrode, a gate electrode and a drain electrode, wherein an input signal input to the gate electrode is amplified by the FET, and an output signal indicating the amplified input signal is output from the drain electrode;

first voltage biasing means, coupled to said source electrode of said FET, for biasing the source electrode at a preset positive potential; and second voltage biasing means, coupled to said gate electrode of said FET, for biasing the gate electrode at a potential lower than the potential of the source electrode during the operation of said FET, wherein said first voltage biasing means comprises a diode having a grounded cathode and an anode coupled to the source electrode of said FET.

2. An amplifier comprising:

a FET having a source electrode, a gate electrode and a drain electrode, wherein an input signal input to the gate electrode is amplified by the FET, and an output signal indicating the amplified input signal is output from the drain electrode;

first voltage biasing means, coupled to said source electrode of said FET, for biasing the source electrode at a preset positive potential; and second voltage biasing means, coupled to said gate electrode of said FET, for biasing the gate electrode at a potential lower than the potential of the source electrode during the operation of said FET, wherein said second voltage biasing means comprises:

a transistor having an emitter and a collector;

a first resistor having one end coupled to a source power terminal and the other end coupled to the emitter of said transistor; and a second resistor having one end coupled to the collector of said transistor and the other end grounded.

3. The amplifier according to claim 2, wherein said second voltage biasing means further comprises a third resistor having one end coupled to the collector of said transistor and the other end coupled to the gate electrode of said FET via strip lines.

4. The amplifier according to claim 1, wherein said FET is a high-electron-mobility, gallium-arsenide, field-effect transistor.

5. The amplifier according to claim 1, wherein said amplifier is a first-stage amplifier provided for use in a low-noise amplifying unit of a global-positioning-system receiving subsystem.

* * * * *